United States Patent
Yamada et al.

(10) Patent No.: US 10,508,363 B2
(45) Date of Patent: Dec. 17, 2019

(54) VAPOR PHASE GROWTH APPARATUS HAVING SUBSTRATE HOLDER WITH RING-SHAPED PROTRUSION

(71) Applicant: NuFlare Technology, Inc., Kanagawa (JP)

(72) Inventors: Takumi Yamada, Yokohama (JP); Takashi Haraguchi, Fujisawa (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/689,518

(22) Filed: Aug. 29, 2017

(65) Prior Publication Data
US 2018/0057958 A1    Mar. 1, 2018

(30) Foreign Application Priority Data
Aug. 31, 2016   (JP) .................. 2016-169913

(51) Int. Cl.
| | | |
|---|---|---|
| *C30B 25/12* | (2006.01) | |
| *C30B 25/10* | (2006.01) | |
| *C30B 25/16* | (2006.01) | |
| *H01L 21/687* | (2006.01) | |

(52) U.S. Cl.
CPC .............. *C30B 25/12* (2013.01); *C30B 25/10* (2013.01); *C30B 25/165* (2013.01); *H01L 21/68714* (2013.01)

(58) Field of Classification Search
CPC ......... C30B 25/00; C30B 25/02; C30B 25/10; C30B 25/12; C30B 25/16; C30B 25/165; C30B 31/00; C30B 31/06; C30B 31/14; H01L 21/68714

USPC .................. 117/200, 204; 118/715, 720, 722, 118/724–725, 728–730
See application file for complete search history.

(56) References Cited

U.S. PATENT DOCUMENTS

| | | | | |
|---|---|---|---|---|
| 2007/0218664 | A1* | 9/2007 | Ito .................. | C23C 16/4584 438/565 |
| 2008/0066684 | A1* | 3/2008 | Patalay ............. | C23C 16/45521 118/728 |
| 2009/0050272 | A1* | 2/2009 | Rosenberg .......... | C23C 14/50 156/345.51 |
| 2013/0104800 | A1* | 5/2013 | Suzuki ............... | C23C 16/4584 117/98 |
| 2018/0114715 | A1* | 4/2018 | Iyechika ........... | H01L 21/68735 |

FOREIGN PATENT DOCUMENTS

| | | | |
|---|---|---|---|
| JP | 04182386 | | 6/1992 |
| JP | 07-058040 | * | 3/1995 |
| JP | 0758040 | | 3/1995 |
| JP | 2002009002 | A2 | 1/2002 |
| JP | 2002343727 | | 11/2002 |

* cited by examiner

*Primary Examiner* — Kenneth A Bratland, Jr.
(74) *Attorney, Agent, or Firm* — Rankin, Hill & Clark LLP

(57) ABSTRACT

A vapor phase growth apparatus according to an embodiment includes a reaction chamber, a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion, and a heater provided below the ring-shaped holder.

12 Claims, 12 Drawing Sheets

VAPOR PHASE GROWTH APPARATUS HAVING SUBSTRATE HOLDER WITH RING-SHAPED PROTRUSION

CROSS-REFERENCE TO RELATED APPLICATION

This application is based upon and claims the benefit of priority from Japanese Patent Applications No. 2016-169913, filed on Aug. 31, 2016, the entire contents of which are incorporated herein by reference.

FIELD OF THE INVENTION

The present invention relates to a vapor phase growth apparatus which supplies gas to form a film.

BACKGROUND OF THE INVENTION

As a method for forming a high-quality semiconductor film, there is an epitaxial growth technique which grows a single-crystal film on a substrate, such as a wafer, using vapor phase growth. In a vapor phase growth apparatus using the epitaxial growth technique, a wafer is placed on a support portion in a reaction chamber which is maintained at atmospheric pressure or reduced pressure.

Then, process gas, such as source gas which will be a raw material for forming a film, is supplied from an upper part of the reaction chamber to the surface of the wafer in the reaction chamber while the wafer is being heated. For example, the thermal reaction of the source gas occurs at the surface of the wafer and an epitaxial single-crystal film is formed on the surface of the wafer.

The characteristics of the epitaxial single-crystal film formed on the surface of the wafer depend on the temperature of the wafer. Therefore, it is preferable to improve the uniformity of the temperature at the wafer surface.

JP H7-58040 discloses a vapor phase growth apparatus in which a protrusion is provided on a susceptor for supporting a wafer in order to reduce the deformation of the wafer and to uniformly heat the wafer.

SUMMARY OF THE INVENTION

A vapor phase growth apparatus according to an aspect of the invention includes: a reaction chamber; a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion; and a heater provided below the ring-shaped holder.

DETAILED DESCRIPTION OF THE EMBODIMENTS

Figure 1:
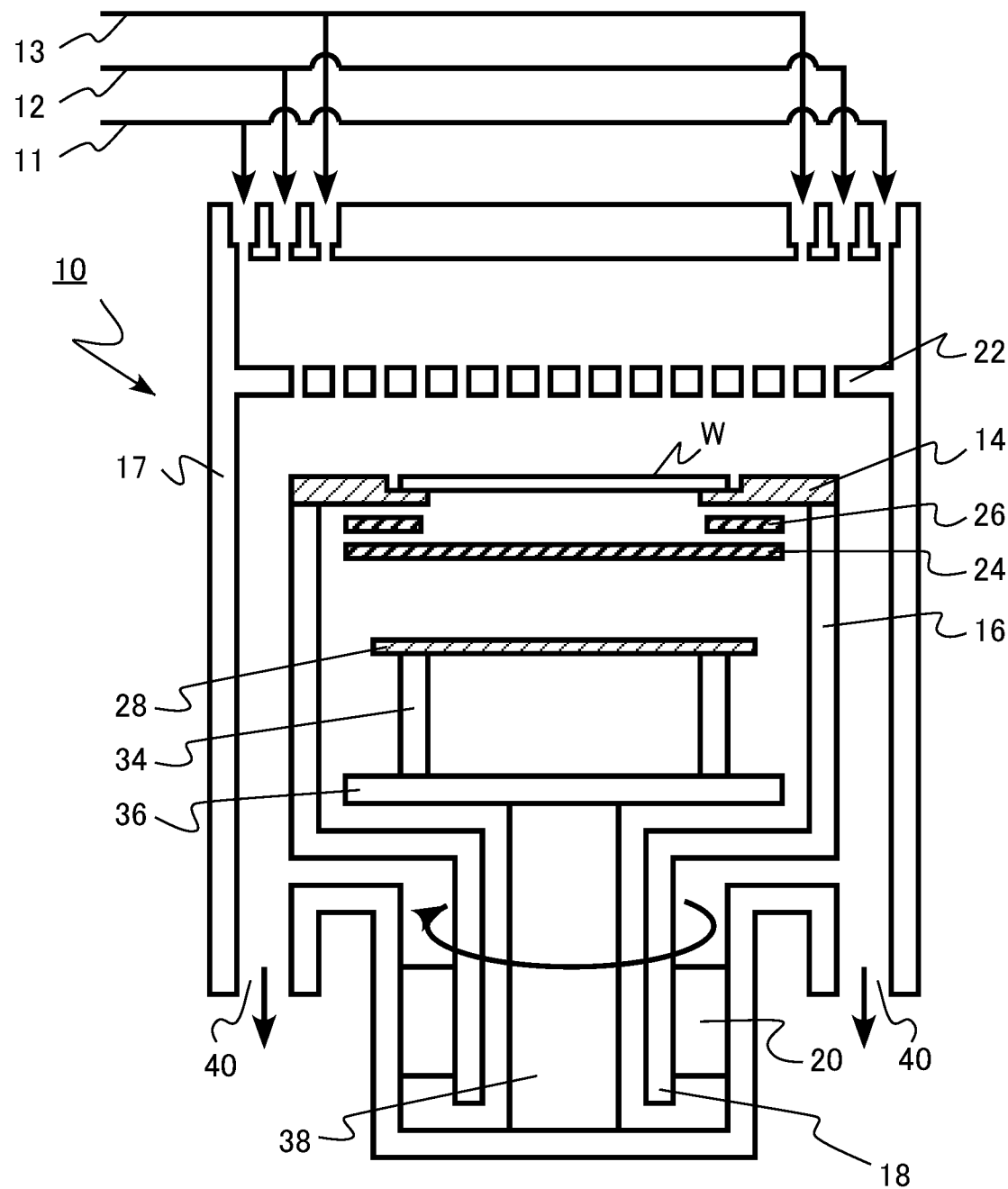
FIG. 1 is a cross-sectional view schematically illustrating a vapor phase growth apparatus according to a first embodiment.

Hereinafter, embodiments of the invention will be described with reference to the drawings.

In the specification, in some cases, the same or similar members are denoted by the same reference numerals.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference. Furthermore, a "longitudinal direction" is the direction of gravity.

In the specification, "process gas" is a general term of gas used to form a film on a substrate. The concept of the "process gas" includes, for example, source gas, carrier gas, and diluent gas.

(First Embodiment)

A vapor phase growth apparatus according to this embodiment includes a reaction chamber, a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion, and a heater provided below the ring-shaped holder.

FIG. 1 is a cross-sectional view schematically illustrating the vapor phase growth apparatus according to this embodiment. The vapor phase growth apparatus according to this embodiment is, for example, a single-wafer-type epitaxial growth apparatus that uses a metal organic chemical vapor deposition method (MOCVD method).

The vapor phase growth apparatus according to this embodiment includes a reaction chamber 10, a first gas supply path 11, a second gas supply path 12, and a third gas supply path 13. The reaction chamber 10 includes a ring-shaped holder 14, a rotating unit 16, a rotating shaft 18, a rotating mechanism 20, a shower plate 22, an in-heater (heater) 24, an out-heater 26, a reflector 28, a support column 34, a fixed table 36, a fixed shaft 38, and a gas outlet 40.

The first gas supply path 11, the second gas supply path 12, and the third gas supply path 13 supply process gas to the reaction chamber 10.

The first gas supply path 11 supplies, for example, a first process gas including organic metal, which is a group-III element, and carrier gas to the reaction chamber 10. The first process gas is gas including a group-III element when a group III-V semiconductor film is formed on a wafer.

The group-III element is, for example, gallium (Ga), aluminum (Al), or indium (In). In addition, the organic metal is, for example, trimethylgallium (TMG), trimethylaluminum (TMA), or trimethylindium (TMI).

The second gas supply path 12 supplies, for example, a second process gas including ammonia ($NH_3$) to the reaction chamber 10. The second process gas is a source gas of a group-V element and nitrogen (N) when a group III-V semiconductor film is formed on a wafer.

The third gas supply path 13 supplies, for example, a diluent gas which dilutes the first process gas and the second process gas to the reaction chamber 10. The first process gas and the second process gas are diluted with the diluent gas to adjust the concentration of the group-III element and the group-V element supplied to the reaction chamber 10. The diluent gas is inert gas, such as hydrogen gas, nitrogen gas, or argon gas, or a mixed gas thereof.

The reaction chamber 10 includes, for example, a stainless cylindrical wall surface 17. The shower plate 22 is provided in an upper part of the reaction chamber 10. A plurality of gas ejection holes are provided in the shower plate 22. The process gas is supplied from the plurality of gas ejection holes to the reaction chamber 10.

The ring-shaped holder 14 is provided in the reaction chamber 10. A wafer (substrate) W can be placed on the ring-shaped holder 14. An opening portion is provided at the center of the ring-shaped holder 14.

The ring-shaped holder 14 is made of ceramics, such as silicon carbide (SiC), tantalum carbide (TaC), boron nitride (BN), and pyrolytic graphite (PG), or carbon as a base material. Carbon coated with, for example, SiC, BN, TaC, or PG can be used as the ring-shaped holder 14.

The ring-shaped holder 14 is fixed to an upper part of the rotating unit 16. The rotating unit 16 is fixed to the rotating shaft 18. The ring-shaped holder 14 is indirectly fixed to the rotating shaft 18.

The rotating shaft 18 can be rotated by the rotating mechanism 20. The rotating mechanism 20 can rotate the rotating shaft to rotate the ring-shaped holder 14. The ring-shaped holder 14 is rotated to rotate the wafer W placed on the ring-shaped holder 14.

For example, the wafer W is rotated at a speed that is equal to or greater than 50 rpm and equal to or less than 3000 rpm. The rotating mechanism 20 includes, for example, a motor and a bearing.

The in-heater 24 and the out-heater 26 are provided below the ring-shaped holder 14. The in-heater 24 and the out-heater 26 are provided in the rotating unit 16. The out-heater 26 is provided between the in-heater 24 and the ring-shaped holder 14.

The in-heater 24 and the out-heater 26 heat the wafer W held by the ring-shaped holder 14. The in-heater 24 heats at least a central portion of the wafer W. The out-heater 26 heats an outer circumferential portion of the wafer W. The in-heater 24 has, for example, a disk shape. The out-heater 26 has, for example, a ring shape.

The reflector 28 is provided below the in-heater 24 and the out-heater 26. The in-heater 24 and the out-heater 26 are provided between the reflector 28 and the ring-shaped holder 14.

The reflector 28 reflects heat that is radiated downward from the in-heater 24 and the out-heater 26 to improve the heating efficiency of the wafer W. In addition, the reflector 28 prevents members below the reflector 28 from being heated. The reflector 28 has, for example, a disk shape.

The reflector 28 is made of a material with high heat resistance. The reflector 28 has, for example, resistance to a heat temperature of 1100° C. or more.

The reflector 28 is made of ceramics, such as SiC, TaC, carbon, BN, and PG, or metal, such as tungsten, as a base material. When the reflector 28 is made of ceramics, a sintered body or a base material produced by vapor phase growth can be used. In addition, the reflector 28 may be made of a material obtained by coating a carbon base material with ceramics, such as SiC, TaC, BN, PG, and glassy carbon.

The reflector 28 is fixed to the fixed table 36 by, for example, a plurality of support columns 34. The fixed table 36 is supported by, for example, the fixed shaft 38.

The rotating unit 16 is provided with, for example, a push-up pin (not illustrated) in order to attach or detach the wafer W to or from the ring-shaped holder 14. The push-up pin passes through, for example, the reflector 28 and the in-heater 24.

A gas outlet 40 is provided at the bottom of the reaction chamber 10. The gas outlet 40 discharges a surplus reaction product after the source gas reacts on the surface of the wafer W and a surplus process gas to the outside of the reaction chamber 10.

A wafer inlet and a gate valve (not illustrated) are provided in the side wall surface 17 of the reaction chamber 10. The wafer W can be loaded to the reaction chamber 10 or can be unloaded from the reaction chamber 10 by the wafer inlet and the gate valve.

Figure 2A:
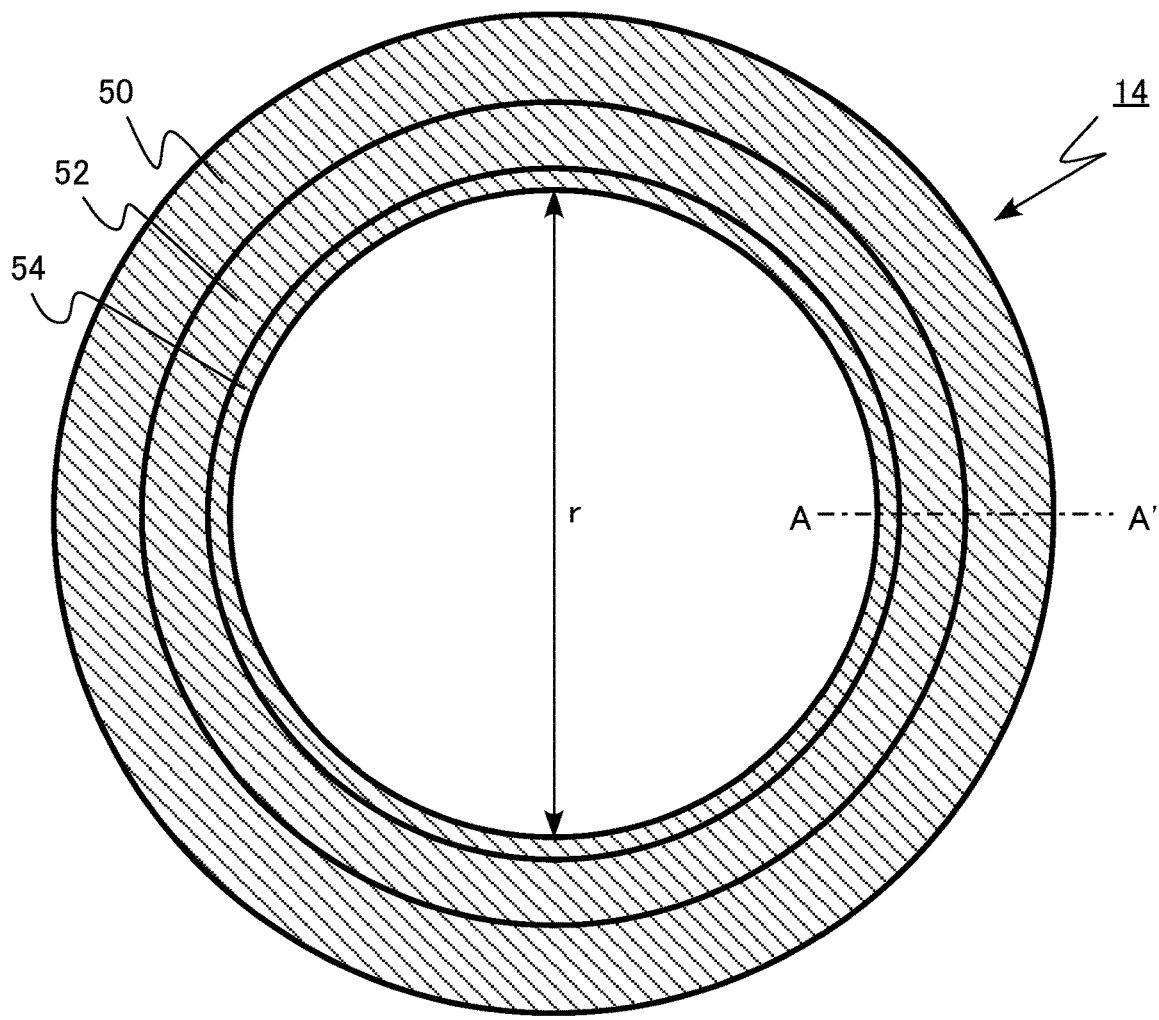
FIGS. 2A and 2B are diagrams schematically illustrating a ring-shaped holder according to the first embodiment.
Figure 2B:
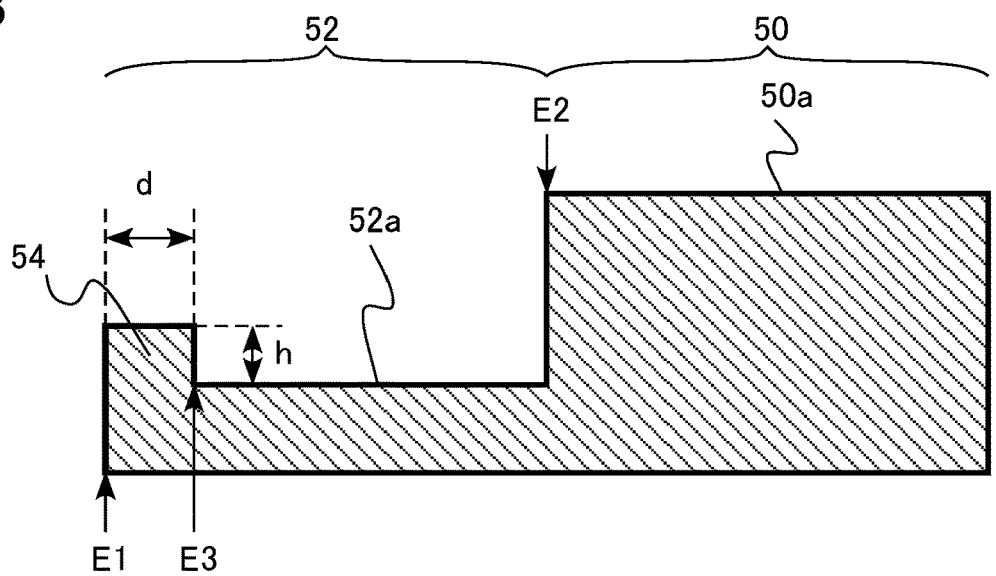

FIGS. 2A and 2B are diagrams schematically illustrating the ring-shaped holder according to this embodiment. FIG. 2A is a top view and FIG. 2B is a cross-sectional view taken along the line AA' of FIG. 2A.

The ring-shaped holder 14 includes an outer portion 50 that forms the outer circumference and an inner portion 52 that is provided inside the outer circumferential portion 50. For example, the outer portion 50 and the inner portion 52 are integrally molded.

The outer portion 50 has a ring shape.

The inner portion 52 has a ring shape. The inner portion 52 is provided inside the outer portion 50. The outer portion 50 surrounds the inner portion 52. Hereinafter, in some cases, the inner end (E2 in FIG. 2B) of the outer portion 50 is referred to as an inner circumferential surface E2 of the outer portion 50.

The inner portion 52 is a counterbore of the ring-shaped holder 14. The wafer W is held on the inner portion 52 and in the outer portion 50.

A ring-shaped protrusion 54 is provided on the inner portion 52. The ring-shaped protrusion 54 is provided so as to be separated from the outer portion 50. In other words, the outer end (E3 in FIG. 2B) of the ring-shaped protrusion 54 is separated from the inner end (E2 in FIG. 2B) of the outer portion 50.

The upper surface of the protrusion 54 is lower than an upper surface 50a of the outer portion 50. The protrusion 54 is provided such that the inner end is flush with the inner end (E1 in FIG. 2B) of the inner portion 52. In other words, the position of the inner end of the protrusion 54 is aligned with the position of the inner end of the inner portion 52.

As illustrated in FIG. 2B, in the cross section of the ring-shaped holder 14 in the radial direction, the height (h in FIG. 2B) of the ring-shaped protrusion 54 is less than, for example, the width (d in FIG. 2B) of the ring-shaped protrusion 54. Since the height of the ring-shaped protrusion 54 is less than the width, the mechanical strength of the ring-shaped protrusion 54 is high.

For example, the corner of the upper end of the ring-shaped protrusion 54 is chamfered. Since the corner is chamfered, the cracking of the ring-shaped protrusion 54 is prevented.

For example, the inside diameter (r in FIG. 2A) of the inner circumferential portion is equal to or greater than 90% of the diameter of the wafer W placed on the ring-shaped holder 14. Since the inside diameter of the inner circumferential portion is equal to or greater than 90% of the diameter of the wafer W, the exposure area of the rear surface of the wafer W is large and it is possible to uniformly heat the wafer W with high efficiency. It is preferable that the inside diameter of the inner circumferential portion be equal to or greater than 95% of the diameter of the wafer W placed on the ring-shaped holder 14.

Next, the function and effect of the vapor phase growth apparatus according to this embodiment will be described.

The characteristics of an epitaxial single-crystal film formed on the surface of the wafer W, for example, the thickness, chemical composition, and crystallinity of the film depend on the temperature of the wafer. Therefore, when there is a large variation in the temperature at the surface of the wafer, the characteristics of the film vary in the plane of the wafer W. Therefore, it is preferable to improve the uniformity of the temperature at the surface of the wafer.

FIGS. 3A, 3B, 4A, 4B, 5A, 5B, 6A, and 6B are diagrams illustrating the function and effect of the vapor phase growth apparatus according to this embodiment.

Figure 3A:
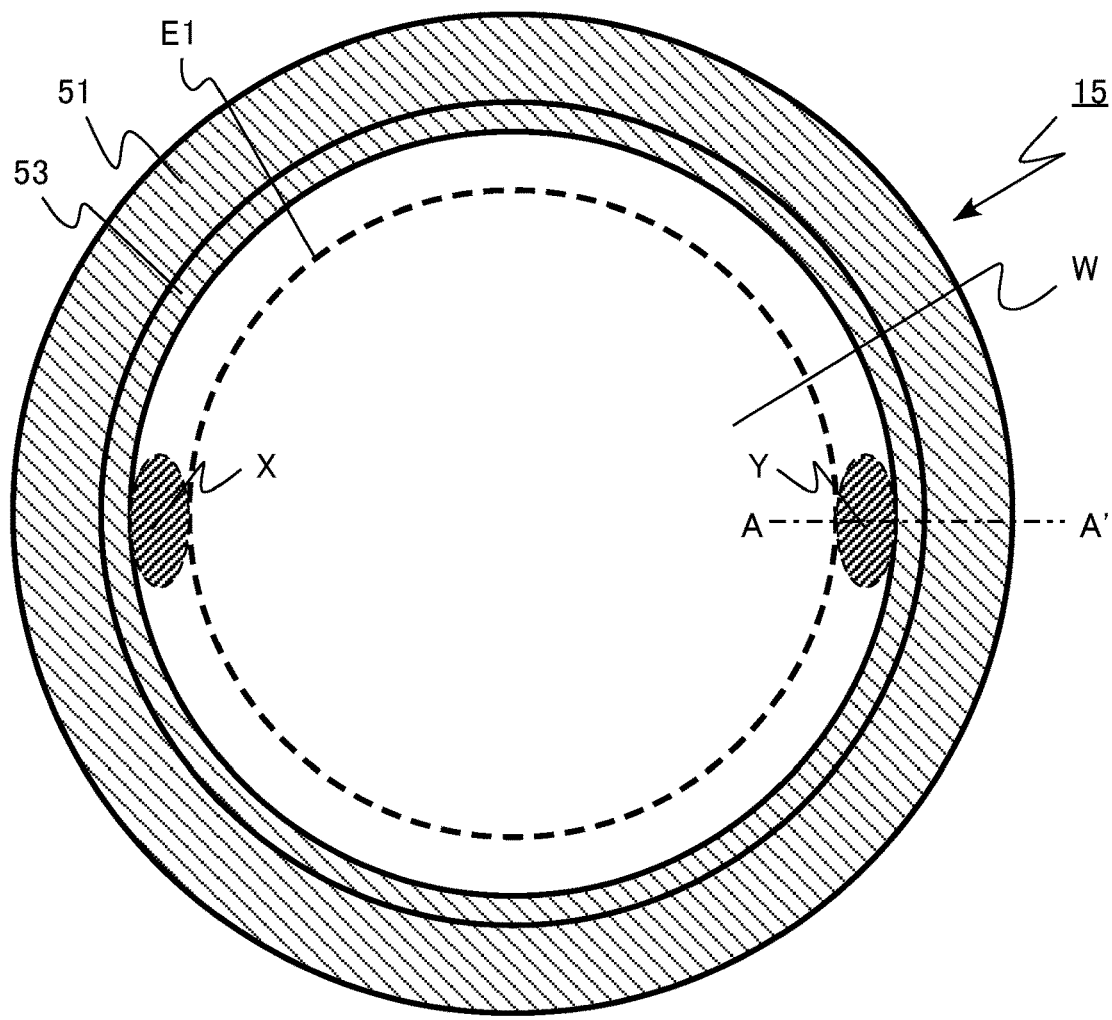
FIGS. 3A and 3B are diagrams illustrating the function and effect of the vapor phase growth apparatus according to the first embodiment.
Figure 3B:
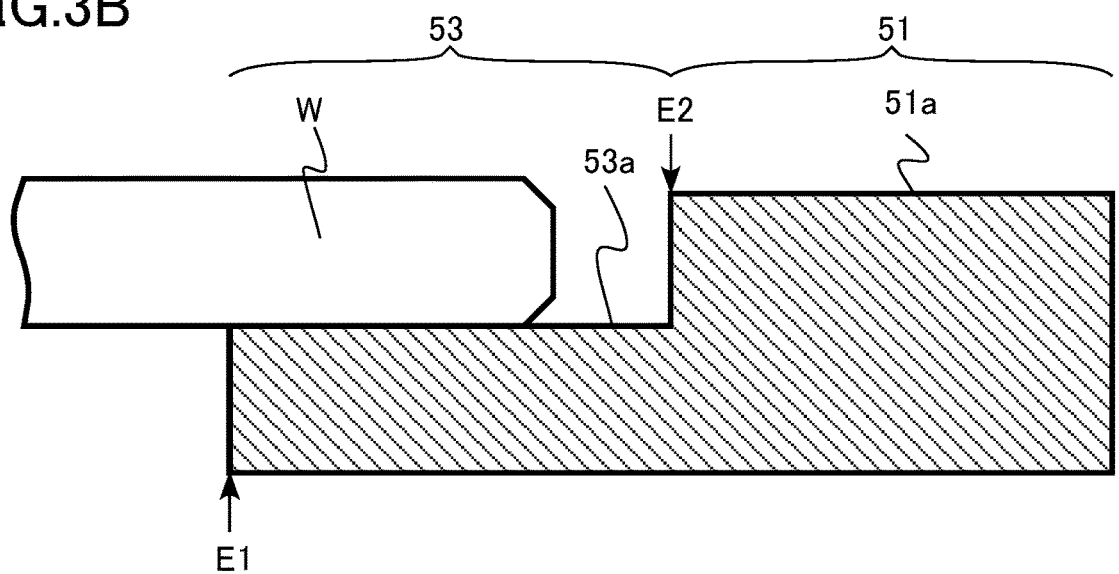

FIGS. 3A and 3B are diagrams schematically illustrating a state in which the wafer W is placed on a ring-shaped holder 15 according to a comparative example. FIGS. 3A and 3B illustrate a state in which the wafer W is placed at the center of the ring-shaped holder 15. FIG. 3A is a top view and FIG. 3B is a cross-sectional view taken along the line AA' of FIG. 3A. In FIG. 3A, the position of the inner end (E1 in FIG. 3B) of a inner portion 53 is represented by a dotted line.

The ring-shaped holder 15 according to the comparative example differs from the ring-shaped holder 14 according to this embodiment in that it does not include the ring-shaped protrusion 54 according to this embodiment on the upper surface of the inner portion 53.

An outer circumferential region of the rear surface of the wafer W comes into contact with an upper surface 53a of the inner portion 53. The wafer W is heated from the rear surface side by the in-heater 24 and the out-heater 26 during deposition. Thermal conduction occurs between the rear surface of the wafer W and the ring-shaped holder 14 through the upper surface 53a.

When the temperature of the wafer W is lower than the temperature of the ring-shaped holder 15, heat is transmitted from the ring-shaped holder 15 to the wafer W. On the contrary, when the temperature of the wafer W is higher than the temperature of the ring-shaped holder 15, heat is transmitted from the wafer W to the ring-shaped holder 15.

In FIGS. 3A and 3B, the wafer W is placed at the center of the ring-shaped holder 15. Therefore, the outer circumferential region of the rear surface of the wafer W uniformly comes into contact with the upper surface 53a. In other words, the contact area between the outer circumferential region of the rear surface of the wafer W and the upper surface 53a is uniform in the circumferential direction of the wafer W.

Therefore, the thermal conduction between the ring-shaped holder 15 and the wafer W in the outer circumferential region of the wafer W is uniform regardless of the position of the wafer W in the circumferential direction. As a result, a variation in the temperature of the wafer W in the circumferential direction is small. For example, the temperature of a region X and the temperature of a region Y in FIG. 3A are substantially equal to each other.

Figure 4A:
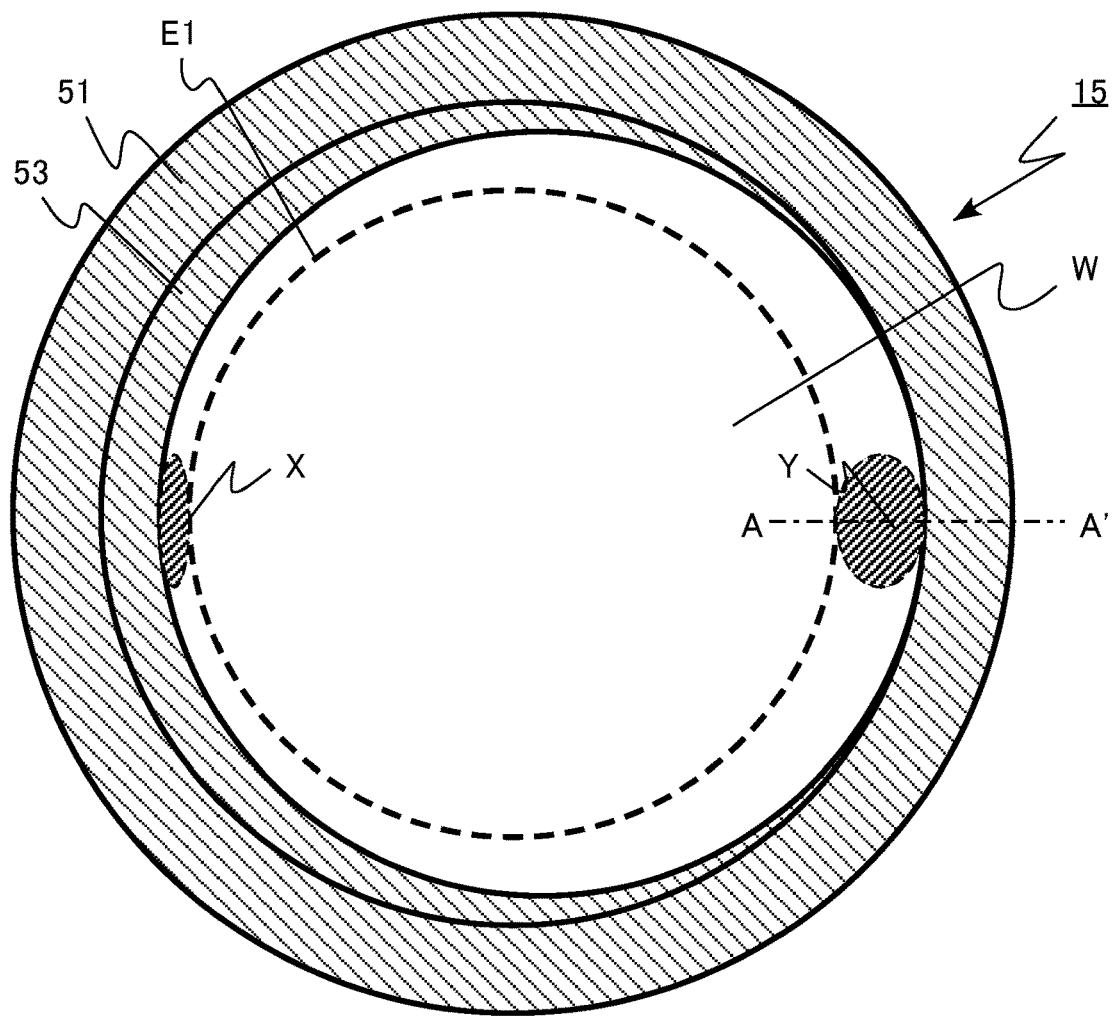
FIGS. 4A and 4B are diagrams illustrating the function and effect of the vapor phase growth apparatus according to the first embodiment.
Figure 4B:
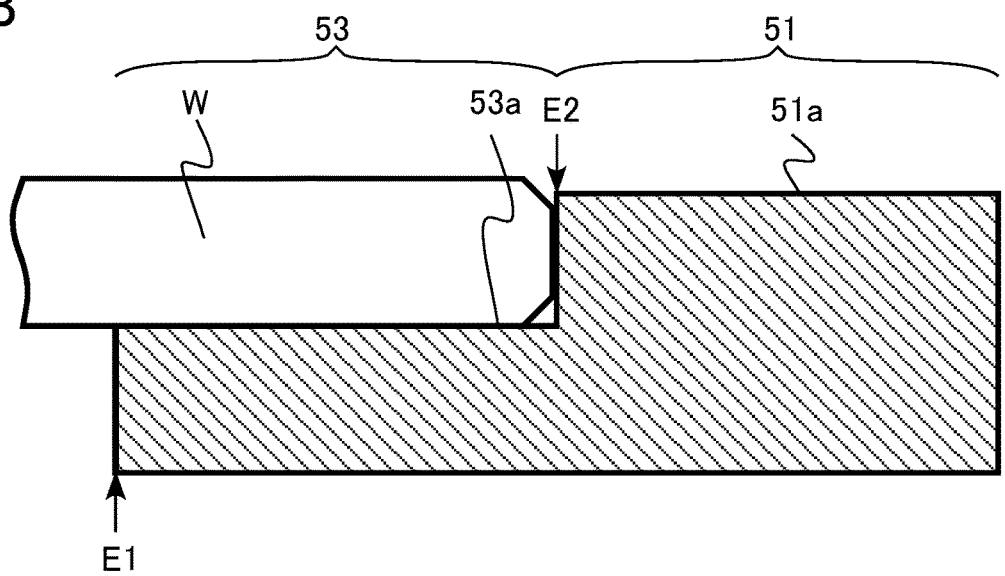

FIGS. 4A and 4B are diagrams schematically illustrating a state in which the wafer W is placed on the ring-shaped holder 15 according to the comparative example. FIGS. 4A and 4B illustrate a state in which the wafer W is placed so as to deviate from the center of the ring-shaped holder 15. FIG. 4A is a top view and FIG. 4B is a cross-sectional view taken along the line AA' of FIG. 4A.

While a film is formed on the wafer W, the ring-shaped holder 15 is rotated with the wafer W placed thereon. At that time, in some cases, the wafer W deviates from the center of the ring-shaped holder 15 due to centrifugal force applied to the wafer W. In this case, for example, as illustrated in FIG. 4B, a portion of the end of the outer circumferential region of the wafer W comes into contact with an inner circumferential surface E2 of the outer portion 51.

As illustrated in FIGS. 4A and 4B, when the wafer W is placed on the ring-shaped holder 15 so as to deviate from the center of the ring-shaped holder 15, the outer circumferential region of the rear surface of the wafer W non-uniformly comes into contact with the upper surface 53a of the inner portion 53. Specifically, since the wafer W leans to one side of the ring-shaped holder 15, the contact area between the wafer W and the upper surface 53a of the inner portion 53 in the region Y is larger than the contact area in the region X in FIG. 4A. That is, the contact area between the outer circumferential region of the rear surface of the wafer W and the upper surface 53a of the inner portion 53 is non-uniform in the circumferential direction of the wafer W.

Therefore, the thermal conduction between the ring-shaped holder 15 and the wafer W in the outer circumferential region of the wafer W is non-uniform depending on the position of the wafer W in the circumferential direction. As a result, a variation in the temperature of the wafer W in the circumferential direction increases. For example, there is a large difference between the temperature of the region X and the temperature of the region Y in FIG. 4A.

Figure 5A:
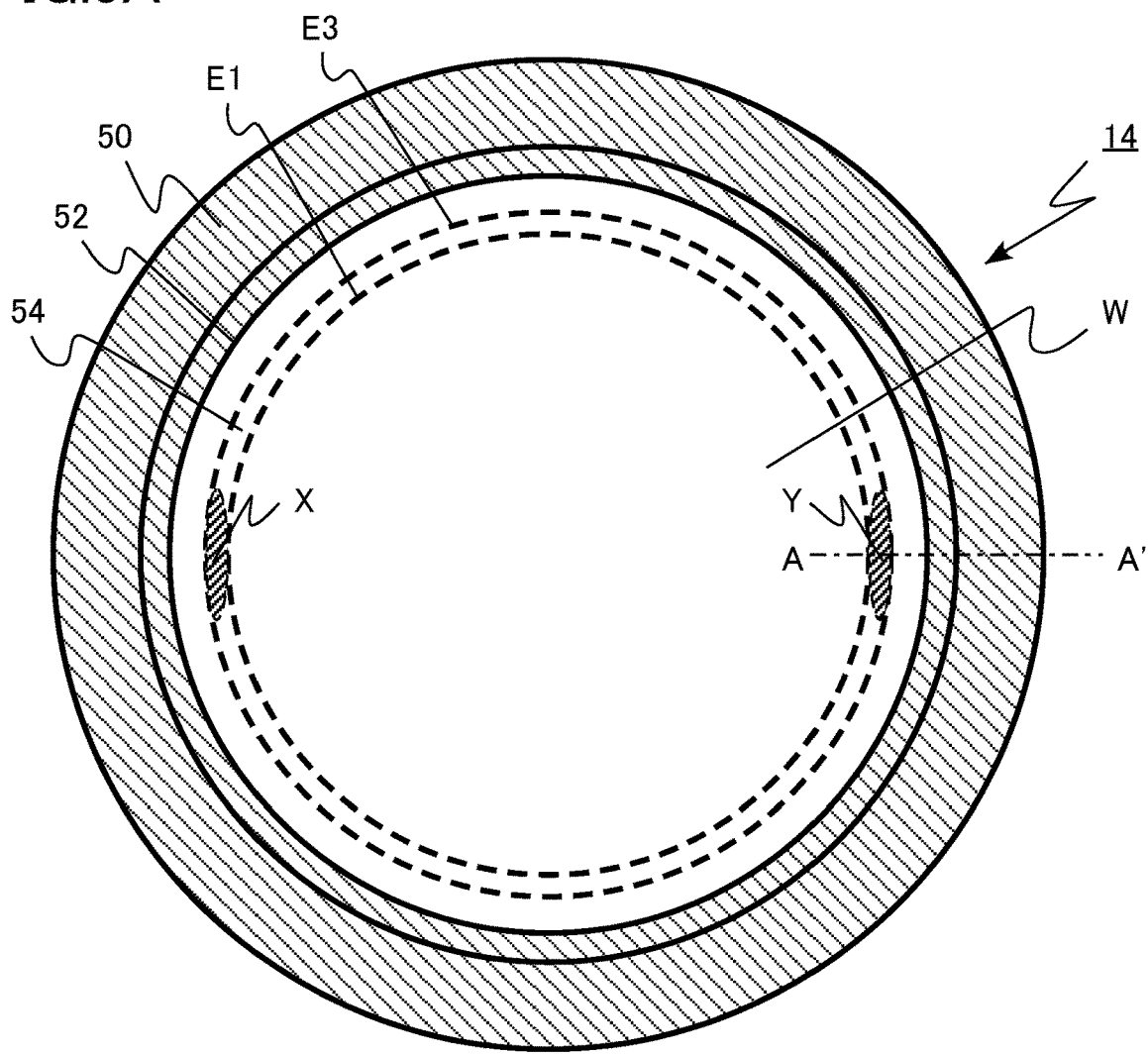
FIGS. 5A and 5B are diagrams illustrating the function and effect of the vapor phase growth apparatus according to the first embodiment.
Figure 5B:
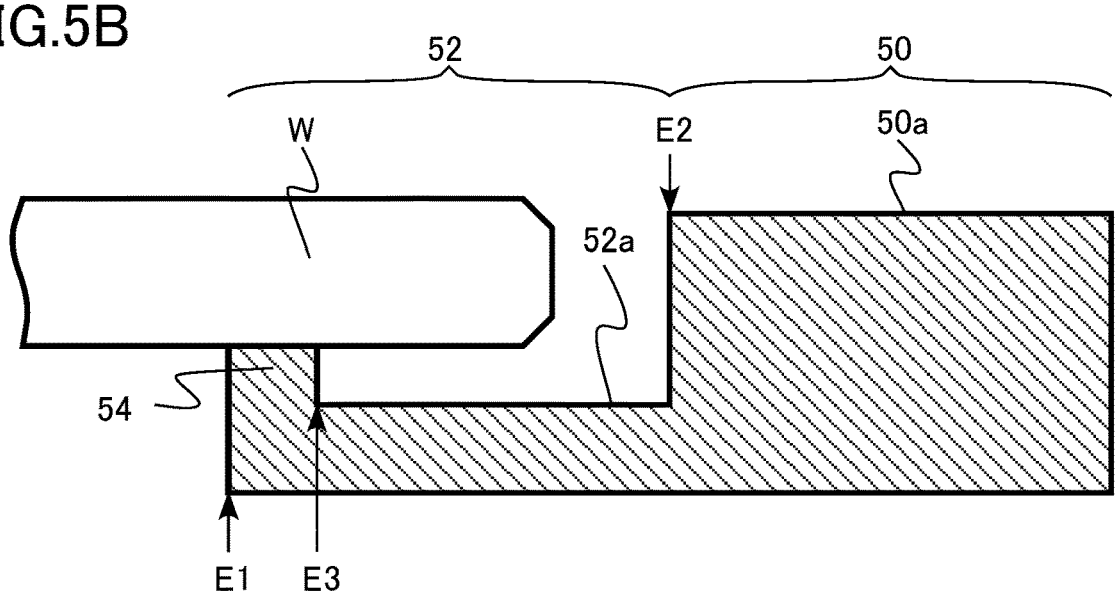

FIGS. 5A and 5B are diagrams schematically illustrating a state in which the wafer W is placed on the ring-shaped holder according to this embodiment. FIGS. 5A and 5B illustrate a state in which the wafer W is placed at the center of the ring-shaped holder 14. FIG. 5A is a top view and FIG.

5B is a cross-sectional view taken along the line AA' of FIG. 5A. In FIG. 5A, the inner end (corresponding to E1 in FIG. 5A) and the outer end E3 of the ring-shaped protrusion 54 are represented by dotted lines.

The outer circumferential region of the rear surface of the wafer W comes into contact with the upper surface of the ring-shaped protrusion 54. During deposition, the wafer W is heated from the rear surface side by the in-heater 24 and the out-heater 26. Thermal conduction occurs between the rear surface of the wafer W and the ring-shaped holder 14 through the upper surface of the ring-shaped protrusion 54.

In FIGS. 5A and 5B, the wafer W is placed at the center of the ring-shaped holder 14. The outer circumferential region of the rear surface of the wafer W uniformly comes into contact with the upper surface of the ring-shaped protrusion 54. Therefore, the thermal conduction between the ring-shaped holder 14 and the wafer W in the outer circumferential region of the wafer W is uniform regardless of the position of the wafer W in the circumferential direction. As a result, a variation in the temperature of the wafer W in the circumferential direction is small. For example, the temperature of a region X and the temperature of a region Y in FIG. 5A are substantially equal to each other.

Figure 6A:
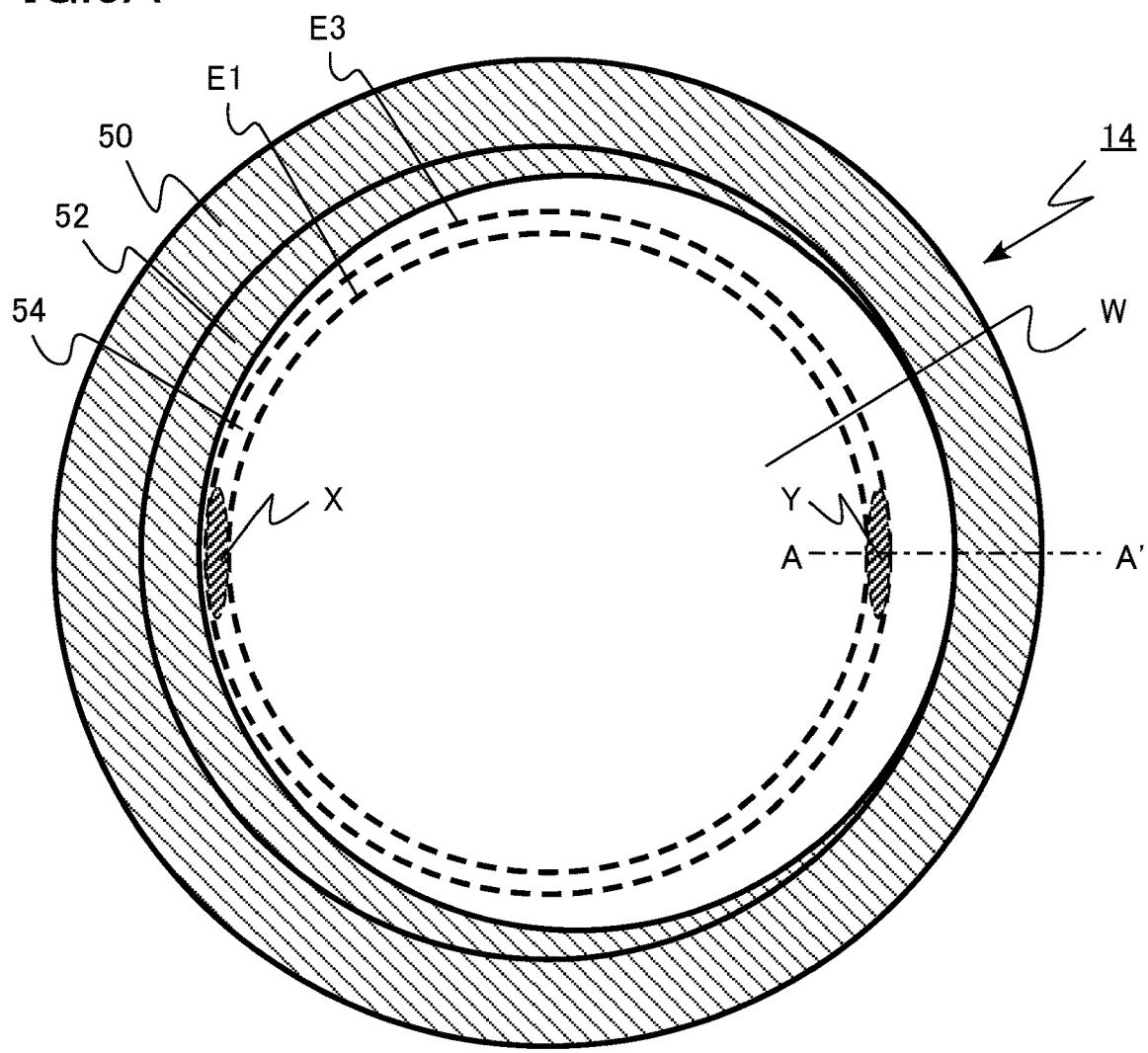
FIGS. 6A and 6B are diagrams illustrating the function and effect of the vapor phase growth apparatus according to the first embodiment.
Figure 6B:
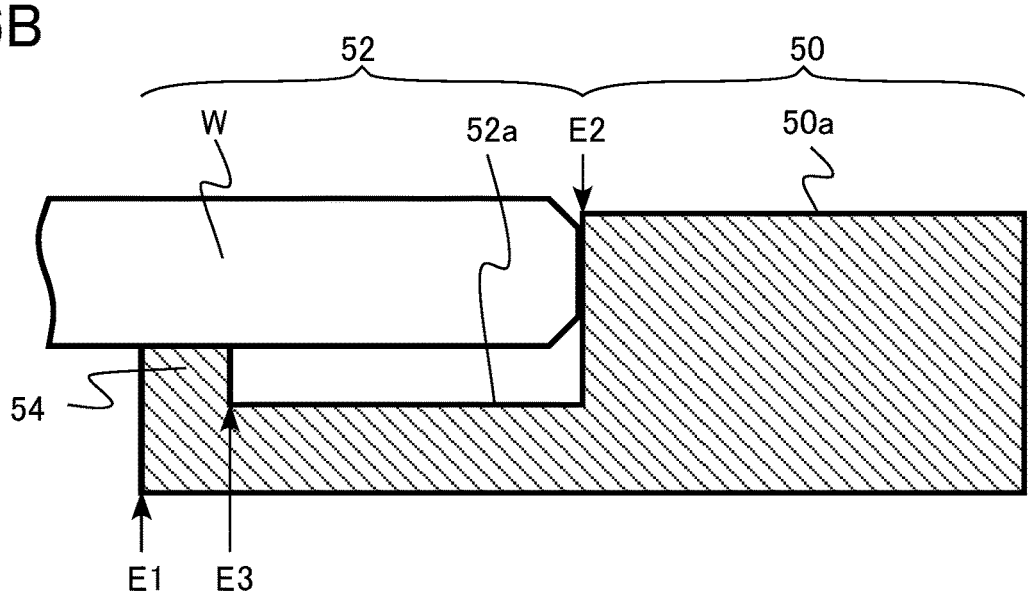

FIGS. 6A and 6B are diagrams schematically illustrating a state in which the wafer W is placed on the ring-shaped holder according to this embodiment. FIGS. 6A and 6B illustrate a state in which the wafer W deviates from the center of the ring-shaped holder 14. FIG. 6A is a top view and FIG. 6B is a cross-sectional view taken along the line AA' of FIG. 6A.

Similarly to the comparative example, for example, as illustrated in FIG. 6B, a portion of the end of the outer circumferential region of the wafer W comes into contact with the inner circumferential surface E2 of the outer portion 50. Even when the wafer W deviates from the center, the outer circumferential region of the rear surface of the wafer W uniformly comes into contact with the upper surface of the ring-shaped protrusion 54. Specifically, since the width of the ring-shaped protrusion 54 is limited, the contact area between the outer circumferential region of the rear surface of the wafer W and the ring-shaped protrusion 54 is uniform in the circumferential direction of the wafer W even when the wafer W deviates from the center.

Therefore, even when the wafer W deviates from the center, a variation in the temperature of the wafer W in the circumferential direction is small. For example, the temperature of a region X and the temperature of a region Y in FIG. 6A are substantially equal to each other.

Figure 7:
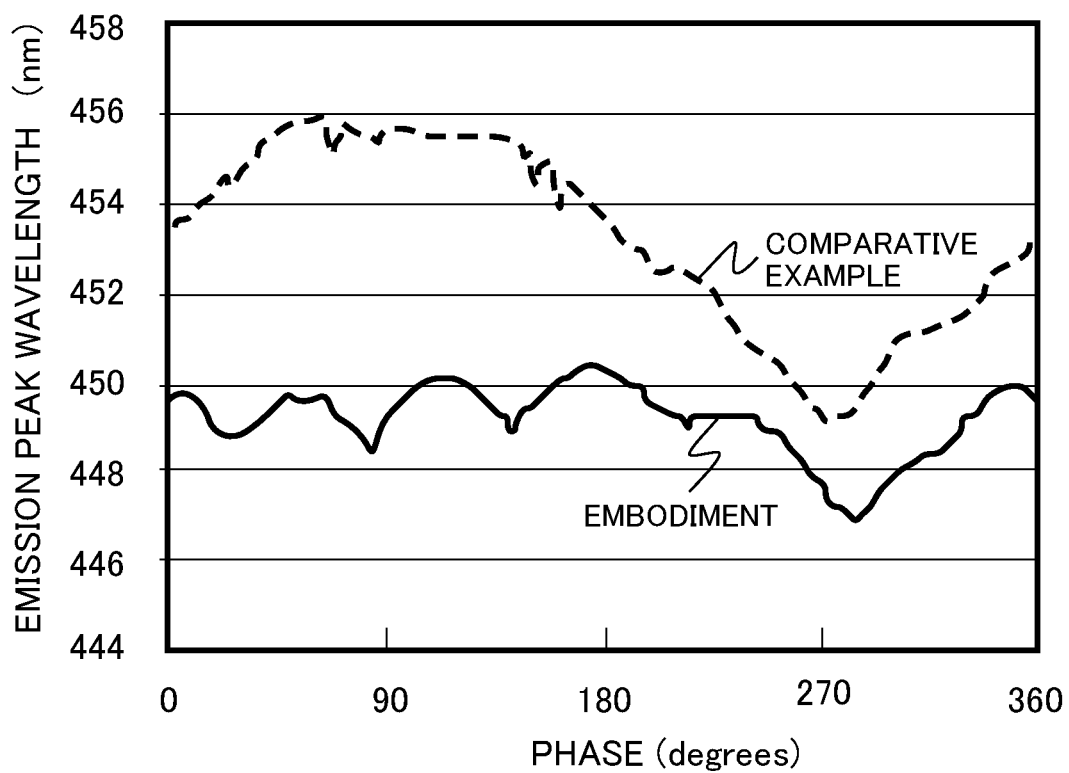
FIG. 7 is a diagram illustrating the function and effect of the vapor phase growth apparatus according to the first embodiment.

FIG. 7 is a diagram illustrating the function and effect of the vapor phase growth apparatus according to this embodiment. In FIG. 7, the horizontal axis indicates the position of the wafer W in the circumferential direction as a phase (angle). In FIG. 7, the vertical axis indicates an emission peak wavelength of a multi-quantum well (MQW) layer for a light emitting diode (LED) which is formed on the wafer W. A measured value is obtained at a position that is 90 mm away from the center of the wafer W. The radius of the wafer W is 100 mm.

The MQW layer is a stacked film of an indium gallium nitride (InGaN) film and a gallium nitride (GaN) film. The emission peak wavelength is obtained by irradiating the wafer W with excitation light and measuring the wavelength of fluorescent light emitted from the MQW layer. FIG. 7 illustrates the dependence of the emission peak wavelength of the outer circumferential portion of the wafer W in the circumferential direction.

When the ring-shaped holder 15 according to the comparative example is used, a variation in the emission peak wavelength in the circumferential direction is about 7 nm. In contrast, when the ring-shaped holder 14 according to this embodiment is used, a variation in the emission peak wavelength in the circumferential direction is about 3.5 nm. When the ring-shaped holder 14 according to this embodiment is used, a variation in the emission peak wavelength in the circumferential direction is reduced by half.

The emission peak wavelength of the MQW layer depends on the temperature of the wafer W at a MQW depositing process step. For example, as the temperature of the wafer W during deposition increases, the emission peak wavelength is reduced. Therefore, it is considered that, when the ring-shaped holder 14 according to this embodiment is used, a variation in the temperature of the outer circumferential portion of the wafer W in the circumferential direction is reduced.

The ring-shaped protrusion 54 of the ring-shaped holder 14 according to this embodiment has a ring-shape. Therefore, the rear surface of the wafer W continuously comes into close contact with the ring-shaped protrusion 54. Thus, gas is prevented from flowing between the rear surface of the wafer W and the ring-shaped holder 14 during deposition. As a result, gas is prevented from flowing between the inside and the outside of the rotating unit 16 during deposition.

When gas flows from the inside to the outside of the rotating unit 16, there is a concern that contaminants will be attached to a film on the wafer W from a member, such as a heater, in the rotating unit 16 and the characteristics of the film will be degraded. In addition, when gas flows from the outside to the inside of the rotating unit 16, there is a concern that a member, such as a heater, in the rotating unit 16 will be etched by the process gas or a foreign material will be attached to a member such as a heater. When the member is etched or when a foreign material is attached to the member, there is a concern that the lifetime of the member will be reduced or the characteristics of the film will be degraded due to a change in deposition conditions.

In particular, the etching of the member causes problems when $H_2$ or ammonium gas with high reactivity is used as the process gas.

According to the ring-shaped holder 14 of this embodiment, the flow of gas between the inside and the outside of the rotating unit 16 during deposition is prevented. Therefore, it is possible to increase the lifetime of a member and to stabilize the characteristics of the film to be formed.

As described above, according to the vapor phase growth apparatus of this embodiment, since a variation in the temperature of the outer circumferential region of the wafer W in the circumferential direction is reduced, it is possible to improve the uniformity of the temperature of the wafer. In addition, it is possible to increase the lifetime of a member and to stabilize the characteristics of the film to be formed.

(Second Embodiment)

A vapor phase growth apparatus according to this embodiment is the same as the vapor phase growth apparatus according to the first embodiment except that, in the vertical cross section of an outer portion, a portion of the inner end of the outer portion protrudes to the inside of the outer portion from another portion of the inner end of the outer portion. Therefore, the description of the same content as that in the first embodiment will not be repeated.

Figure 8A:
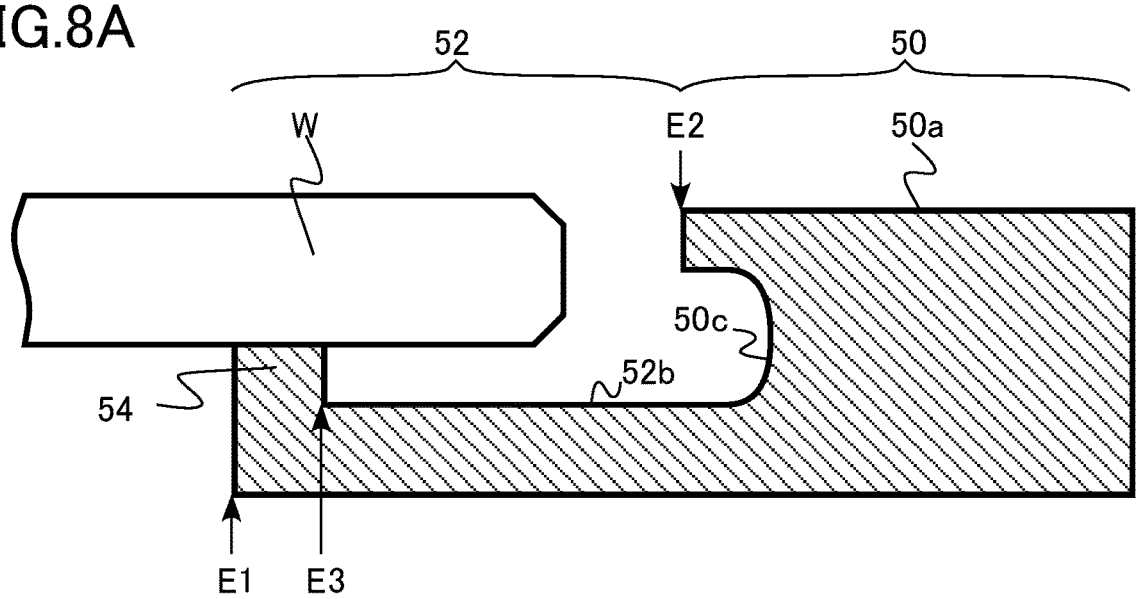
FIGS. 8A and 8B are cross-sectional views schematically illustrating a portion of a ring-shaped holder according to a second embodiment.
Figure 8B:
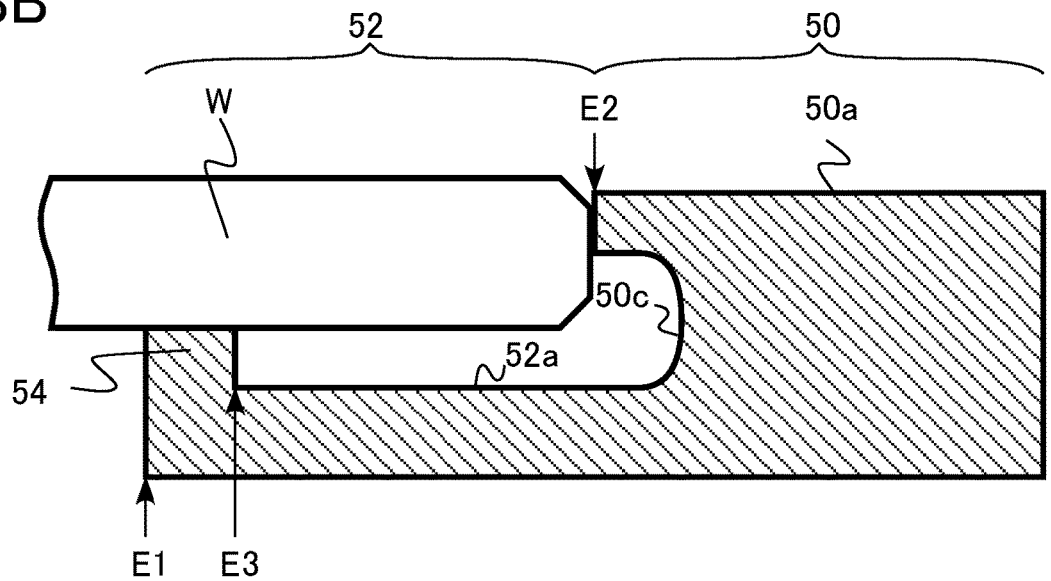

FIGS. 8A and 8B are cross-sectional views schematically illustrating a portion of a ring-shaped holder according to this embodiment. FIG. 8A illustrates a state in which the wafer W is placed at the center of the ring-shaped holder 14.

FIG. 8B illustrates a state in which the wafer W is placed so as to deviate from the center of the ring-shaped holder 14.

In the ring-shaped holder 14 according to this embodiment, in the vertical cross section of an outer portion 50, a portion of the inner end (E2 in FIGS. 8A and 8B) of the outer portion 50 protrudes to the inside of the outer portion 50 from another portion of the inner end of the outer portion 50. Specifically, the upper end of the inside of the outer portion 50 protrudes and a recess 50c is formed in the inner circumferential surface of the outer portion 50. In other words, the upper end of the inside of the outer portion 50 has an overhang shape.

For example, in the case of the ring-shaped holder 14 according to the first embodiment, when the wafer W deviates from the center of the ring-shaped holder 14 as illustrated in FIG. 6A, a portion of the end of the wafer W comes into contact with the inner end (E2 in FIG. 6B) of the outer portion 50. In this case, thermal conduction occurs between the end of the wafer W and the ring-shaped holder 14 through the inner end E2 of the outer portion 50.

Therefore, there is a concern that a temperature difference will occur between a contact region between the end of the wafer W and the ring-shaped holder 14 and a non-contact region between the end of the wafer W and the ring-shaped holder 14. Specifically, there is a concern that a temperature difference between the region X and the region Y in FIG. 6A will increase.

In the ring-shaped holder 14 according to this embodiment, the upper end of the inside of the outer portion 50 protrudes. Therefore, as illustrated in FIG. 8B, the contact area between the wafer W and the outer portion 50 is less than that in the first embodiment.

Therefore, the thermal conduction between the end of the wafer W and the ring-shaped holder 14 through the inner end E2 of the outer portion 50 is prevented. As a result, a variation in the temperature of the outer circumferential region of the wafer W in the circumferential direction is reduced.

As described above, this embodiment is effective in reducing the non-uniform inflow of heat from the outer portion 50 in the circumferential direction even when the ring-shaped protrusion 54 is not provided. When this embodiment is used without the ring-shaped protrusion 54 and the wafer W is placed so as to deviate from the center of the ring-shaped holder 14, the contact between the rear surface of the wafer W and the upper surface 52a of the inner portion 52 is likely to be non-uniform in the circumferential direction. In order to solve this problem, the diameter of the inner end E2 of the outer portion 50 is preferably as close to the diameter of the wafer W as possible. In this case, it is possible to reduce the degree of deviation of the wafer W from the center of the ring-shaped holder 14. In this way, it is possible to reduce the thermal contact between the wafer W and the inner circumferential surface E2 of the outer portion 50 while ensuring the uniformity of the contact between the rear surface of the wafer W and the upper surface 52a of the inner portion 52 in the circumferential direction. Therefore, it is possible to reduce the non-uniform inflow of heat from the inner circumferential surface E2 to the wafer W in the circumferential direction and to improve the uniformity of the temperature of the outer circumferential portion of the wafer W in the circumferential direction.

(Modification Example)

Figure 9A:
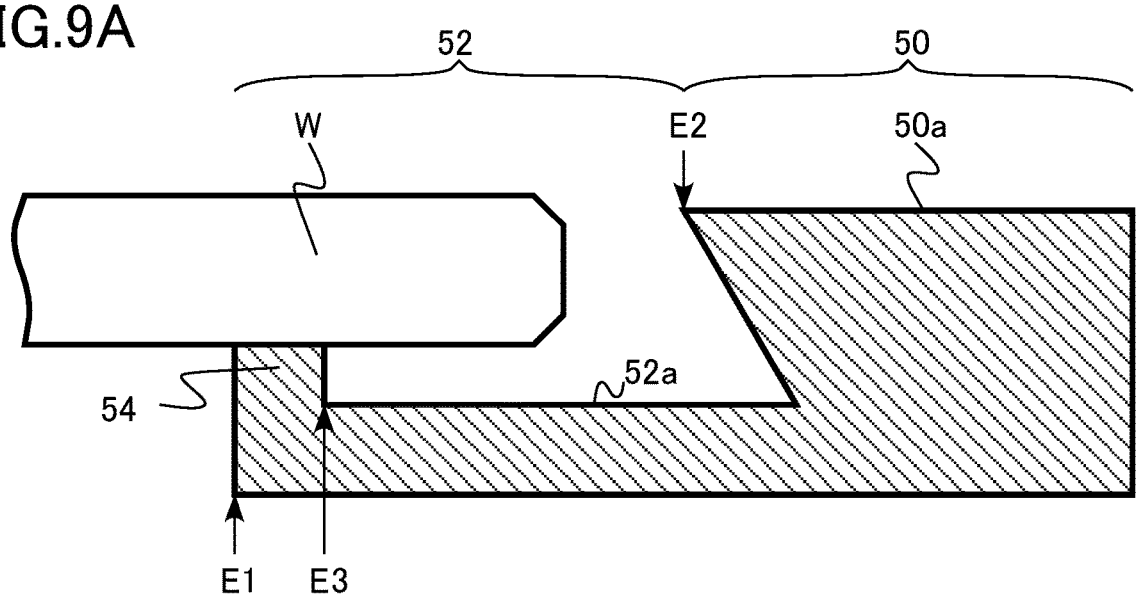
FIGS. 9A and 9B are cross-sectional views schematically illustrating a portion of a ring-shaped holder according to a modification example of the second embodiment.
Figure 9B:
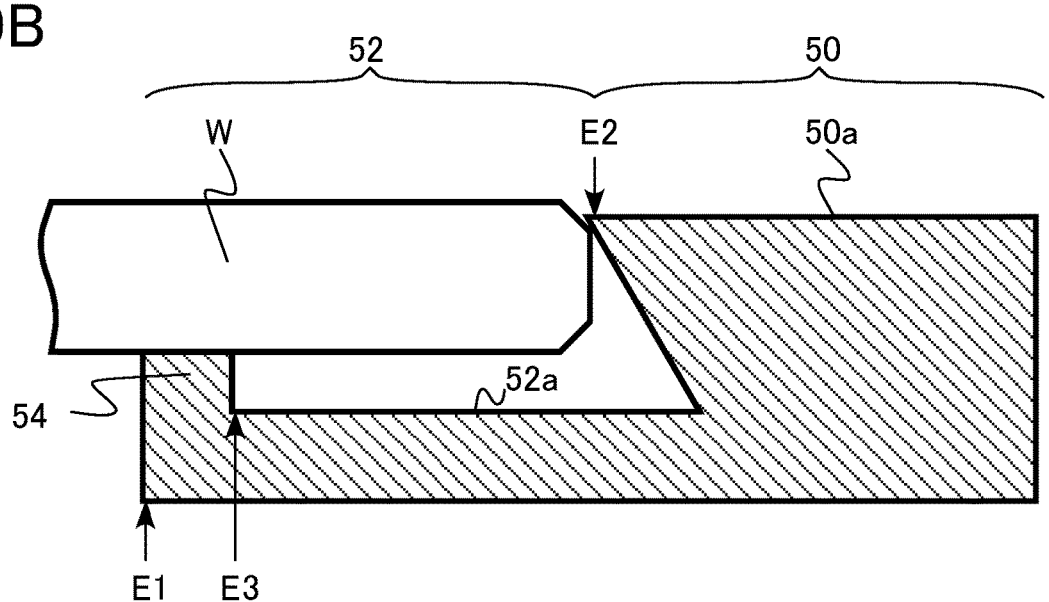

FIGS. 9A and 9B are cross-sectional views schematically illustrating a portion of a ring-shaped holder according to a modification example of this embodiment. FIG. 9A illustrates a state in which the wafer W is placed at the center of a ring-shaped holder 14. FIG. 9B illustrates a state in which the wafer W is placed so as to deviate from the center of the ring-shaped holder 14.

In the ring-shaped holder 14 according to the modification example of this embodiment, an upper end of the inside of an outer portion 50 protrudes at an acute angle. According to the ring-shaped holder 14 of the modification example of this embodiment, the same effect as that in this embodiment is obtained.

As described above, according to the vapor phase growth apparatuses of this embodiment and the modification example, a variation in the temperature of the outer circumferential region of the wafer W in the circumferential direction can be less than that in the first embodiment. Therefore, it is possible to further improve the uniformity of the temperature of the wafer.

As described above, the modification example is effective in reducing the non-uniform inflow of heat from the outer portion 50 in the circumferential direction even when the ring-shaped protrusion 54 is not provided. When this modification example is used without the ring-shaped protrusion 54 and the wafer W is placed so as to deviate from the center of the ring-shaped holder 14, the contact between the rear surface of the wafer W and the upper surface 52a of the inner portion 52 is likely to be non-uniform in the circumferential direction. In order to solve this problem, the diameter of the inner end E2 of the outer portion 50 is preferably as close to the diameter of the wafer W as possible. In this case, it is possible to reduce the degree of deviation of the wafer W from the center of the ring-shaped holder 14. In this way, it is possible to reduce the thermal contact between the wafer W and the inner circumferential surface E2 of the outer portion 50 while ensuring the uniformity of the contact between the rear surface of the wafer W and the upper surface 52a of the inner portion 52 in the circumferential direction. Therefore, it is possible to reduce the non-uniform inflow of heat from the inner circumferential surface E2 to the wafer W in the circumferential direction and to improve the uniformity of the temperature of the outer circumferential portion of the wafer W in the circumferential direction.

(Third Embodiment)

A vapor phase growth apparatus according to this embodiment is the same as the vapor phase growth apparatus according to the first embodiment except that it includes a plurality of island-shaped protrusions which protrude to the inside of an outer portion and are separated from a ring-shaped protrusion. Therefore, the description of the same content as that in the first embodiment will not be repeated.

Figure 10A:
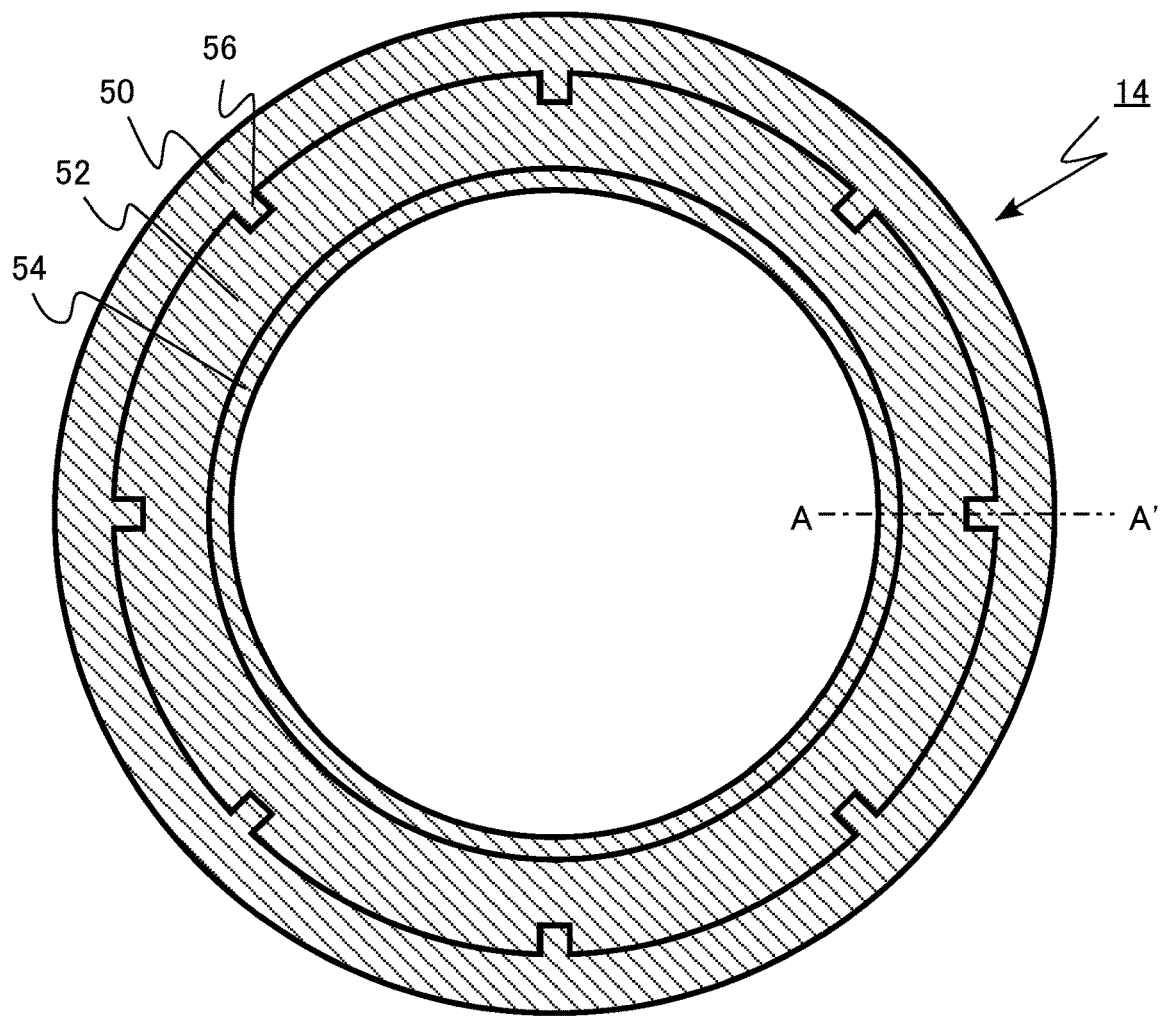
FIGS. 10A and 10B are diagrams schematically illustrating a ring-shaped holder according to a third embodiment.
Figure 10B:
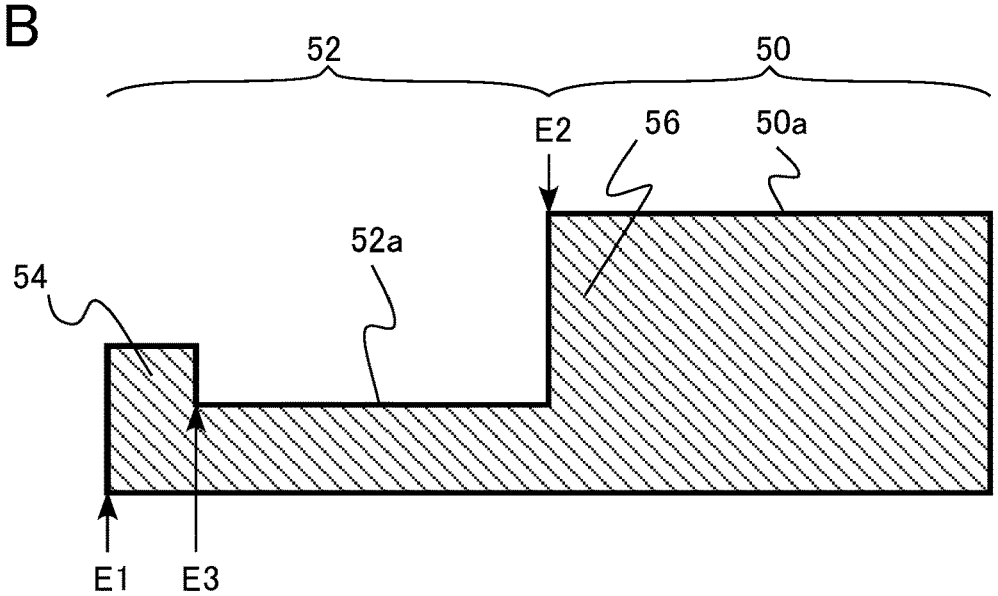

FIGS. 10A and 10B are diagrams schematically illustrating a ring-shaped holder according to this embodiment. FIG. 10A is a top view and FIG. 10B is a cross-sectional view taken along the line AA' of FIG. 10A.

A ring-shaped holder 14 according to this embodiment includes a plurality of island-shaped protrusions 56 which are provided on the inner end (E2 in FIG. 10B) of an outer portion 50 so as to protrude to the inside of the outer portion 50 in the horizontal cross section of the outer portion 50. For example, eight island-shaped protrusions 56 are provided on the inner circumferential surface E2 of the outer portion 50 so as to protrude in a central direction from the inner end of the outer portion 50. The plurality of island-shaped protrusions 56 are separated from a ring-shaped protrusion 54.

Figure 11:
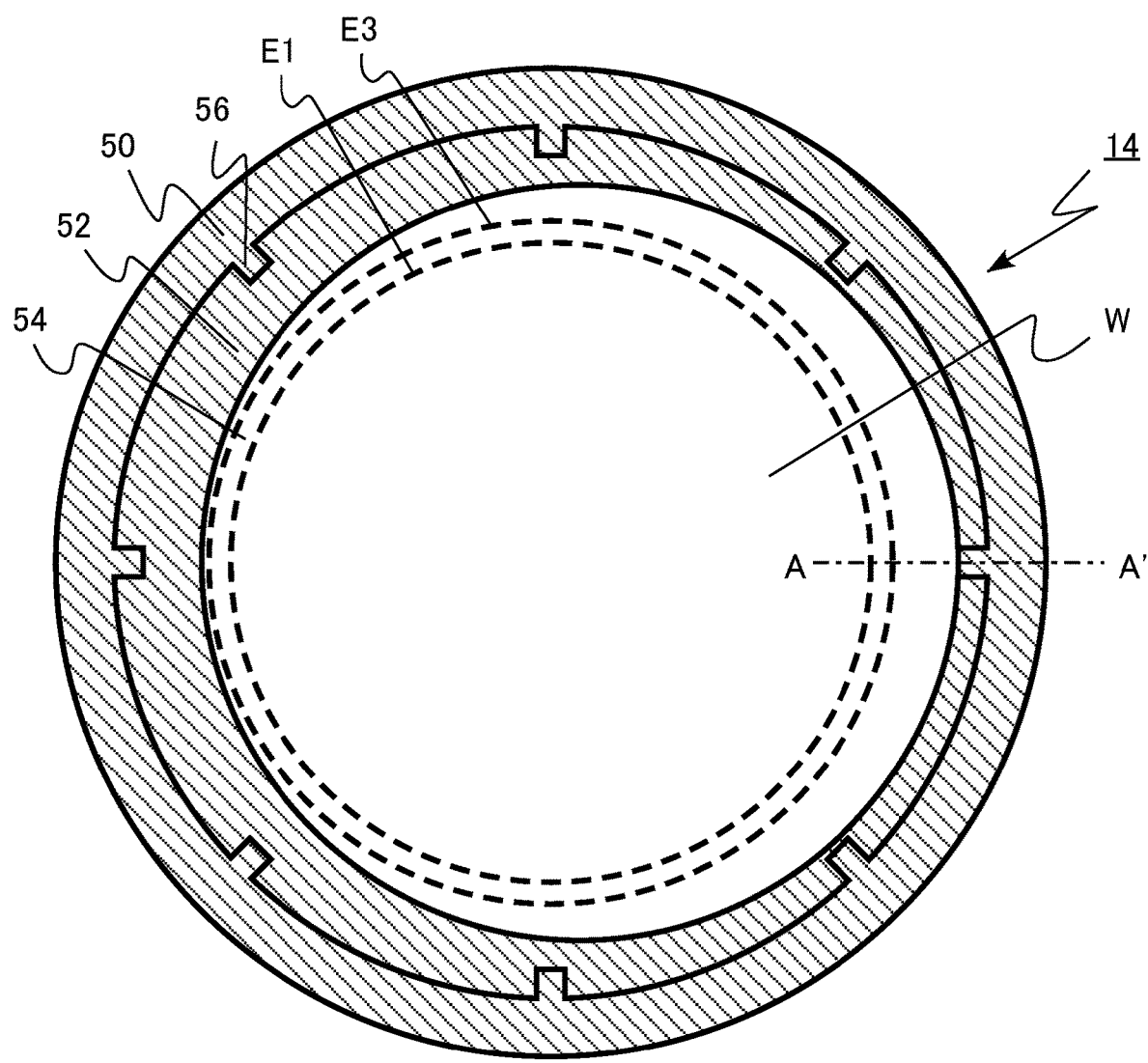
FIG. 11 is a diagram illustrating the function and effect of a vapor phase growth apparatus according to the third embodiment.

FIG. 11 is a diagram illustrating the function and effect of the vapor phase growth apparatus according to this embodiment. When the wafer W deviates from the center of the ring-shaped holder 14, the end of the wafer W comes into contact with only the island-shaped protrusions 56 on the inner circumferential surface of the outer portion 50. Therefore, the contact area between the end of the wafer W and the inner circumferential surface of the outer portion 50 is less than that in the first embodiment illustrated in FIG. 6. As a result, a variation in the temperature of the outer circumferential portion of the wafer W in the circumferential direction is further reduced.

The number of island-shaped protrusions 56 is not necessarily limited to 8. The number of island-shaped protrusions 56 may be less than 8 or may be greater than 8. However, when the wafer W deviates from the center of the ring-shaped holder 14, it is preferable that the end of the wafer W certainly come into contact with the protrusions 56. From this point of view, it is preferable that the number of island-shaped protrusions 56 be at least 3 or more.

According to the vapor phase growth apparatuses of this embodiment, a variation in the temperature of the outer circumferential region of the wafer W in the circumferential direction can be less than that in the first embodiment. Therefore, it is possible to further improve the uniformity of the temperature of the wafer.

As described above, this embodiment is effective in reducing the non-uniform inflow of heat from the outer portion 50 in the circumferential direction even when the ring-shaped protrusion 54 is not provided. When this embodiment is used without the ring-shaped protrusion 54 and the wafer W is placed so as to deviate from the center of the ring-shaped holder 14, the contact between the rear surface of the wafer W and the upper surface 52a of the inner portion 52 is likely to be non-uniform in the circumferential direction. In order to solve this problem, the diameter of the inner end E2 of the outer portion 50 is preferably as close to the diameter of the wafer W as possible. In this case, it is possible to reduce the degree of deviation of the wafer W from the center of the ring-shaped holder 14. In this way, it is possible to reduce the thermal contact between the wafer W and the inner circumferential surface E2 of the outer portion 50 while ensuring the uniformity of the contact between the rear surface of the wafer W and the upper surface 52a of the inner portion 52 in the circumferential direction. Therefore, it is possible to reduce the non-uniform inflow of heat from the inner circumferential surface E2 to the wafer W in the circumferential direction and to improve the uniformity of the temperature of the outer circumferential portion of the wafer W in the circumferential direction.

(Fourth Embodiment)

A vapor phase growth apparatus according to this embodiment is the same as the vapor phase growth apparatus according to the third embodiment except that, in the vertical cross section of an island-shaped protrusion protruding in a central direction, a recess is formed in the island-shaped protrusion. Therefore, the description of the same content as that in the third embodiment will not be repeated.

Figure 12:
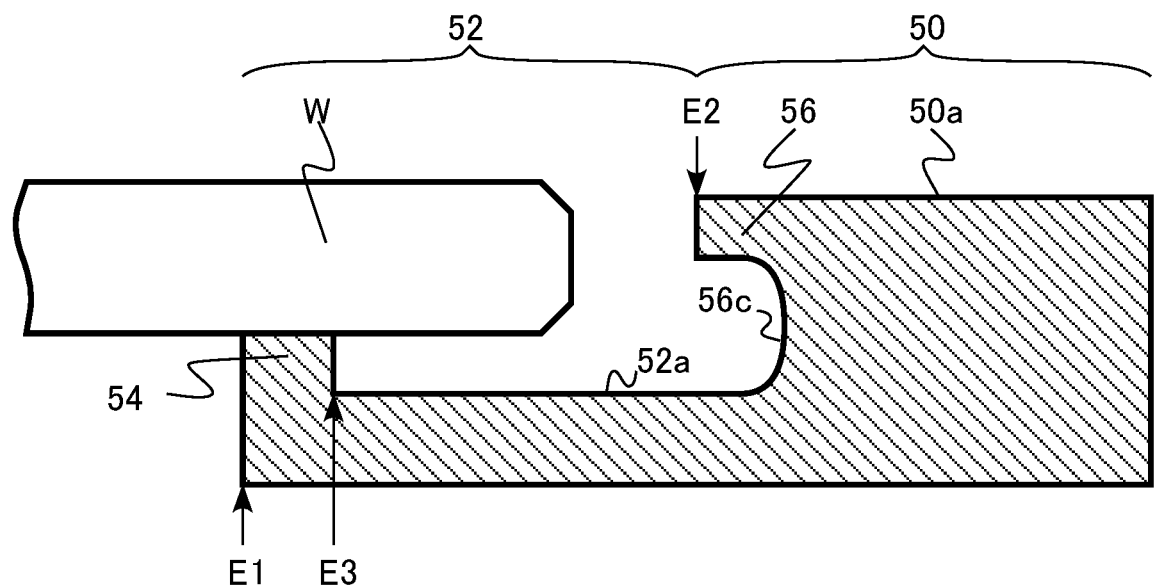
FIG. 12 is a cross-sectional view schematically illustrating a portion of a ring-shaped holder according to a fourth embodiment.

FIG. 12 is a cross-sectional view schematically illustrating a portion of a ring-shaped holder according to this embodiment. FIG. 12 illustrates a state in which the wafer W is placed at the center of a ring-shaped holder 14.

In the ring-shaped holder 14 according to this embodiment, in the vertical cross section of an island-shaped protrusion 56, a portion of the island-shaped protrusion 56 protrudes. In the vertical cross section of an island-shaped protrusion 56, a portion of the inner end of the island-shaped protrusion 56 protrudes inward from another portion. Specifically, the upper part of the island-shaped protrusion 56 protrudes inward from the lower part of the island-shaped protrusion 56 and a recess 56c is formed. In other words, the upper part of the island-shaped protrusion 56 has an overhang shape.

According to the ring-shaped holder 14 of this embodiment, the contact area between the end of the wafer W and the inner end of the outer portion 50 is less than that in the first, second, and third embodiments. Therefore, it is possible to further reduce a variation in the temperature of the outer circumferential region of the wafer W in the circumferential direction and thus to further improve the uniformity of the temperature of the wafer.

As described above, this embodiment is effective in reducing the non-uniform inflow of heat from the outer portion 50 in the circumferential direction even when the ring-shaped protrusion 54 is not provided. When this embodiment is used without the ring-shaped protrusion 54 and the wafer W is placed so as to deviate from the center of the ring-shaped holder 14, the contact between the rear surface of the wafer W and the upper surface 52a of the inner portion 52 is likely to be non-uniform in the circumferential direction. In order to solve this problem, the diameter of the inner end E2 of the outer portion 50 is preferably as close to the diameter of the wafer W as possible. In this case, it is possible to reduce the degree of deviation of the wafer W from the center of the ring-shaped holder 14. In this way, it is possible to reduce the thermal contact between the wafer W and the inner circumferential surface E2 of the outer portion 50 while ensuring the uniformity of the contact between the rear surface of the wafer W and the upper surface 52a of the inner portion 52 in the circumferential direction. Therefore, it is possible to reduce the non-uniform inflow of heat from the inner circumferential surface E2 to the wafer W in the circumferential direction and to improve the uniformity of the temperature of the outer circumferential portion of the wafer W in the circumferential direction.

(Fifth Embodiment)

A vapor phase growth apparatus according to this embodiment is the same as the vapor phase growth apparatus according to the first embodiment except that a ring-shaped protrusion is provided at a predetermined distance from the inner circumference of an inner portion. In other words, this embodiment is the same as the first embodiment except that the inner end of the ring-shaped protrusion is not flush with the inner end of the inner portion. Therefore, the description of the same content as that in the first embodiment will not be repeated.

Figure 13:
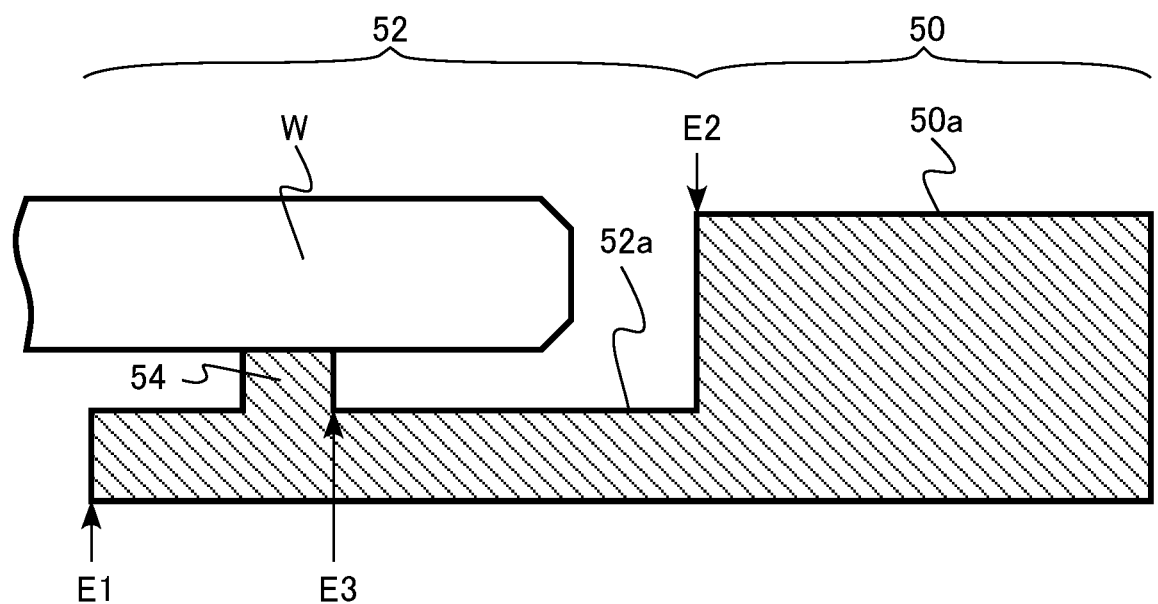
FIG. 13 is a cross-sectional view schematically illustrating a portion of a ring-shaped holder according to a fifth embodiment.

FIG. 13 is a cross-sectional view schematically illustrating a portion of a ring-shaped holder according to this embodiment. FIG. 13 illustrates a state in which the wafer W is placed at the center of a ring-shaped holder 14.

In the ring-shaped holder 14 according to this embodiment, the inner end (E1 in FIG. 13) of an inner portion 52 and the ring-shaped protrusion 54 are separated from each other by a predetermined distance. In other words, the inner circumference of the inner portion 52 protrudes inward from a ring-shaped protrusion 54.

The temperature of the outer circumferential portion of the wafer W depends on the amount of heat transmitted by the thermal conduction between the wafer W and the ring-shaped holder 14. For example, when the temperature of the ring-shaped holder 14 is higher than the temperature of the wafer W during deposition, there is a concern that the temperature of the outer circumferential portion of the wafer W will be significantly higher than the temperature of other portions due to thermal conduction from the ring-shaped holder 14 to the wafer W. In particular, when a ring-shaped out-heater 26 that heats the outer circumferential region of the wafer W is provided, this tendency becomes noticeable.

According to the ring-shaped holder 14 of this embodiment, the inner portion 52 that protrudes inward from the ring-shaped protrusion 54 shields heat radiated from the in-heater 24 and the out-heater 26 that heat the outer circumferential portion of the wafer W. Therefore, the temperature of the outer circumferential portion of the wafer W is prevented from being higher than the temperature of other portions. As a result, it is possible to further improve the uniformity of the temperature of the wafer.

This embodiment may be combined with the second embodiment illustrated in FIGS. 8A and 8B, the modification example of the second embodiment illustrated in FIGS. 9A and 9B, the third embodiment illustrated in FIGS. 10A and 10B, and the fourth embodiment illustrated in FIG. 12. Combinations of this embodiment and other embodiments make it possible to improve temperature distributions in the circumferential direction and the radial direction in the vicinity of the outer circumference of the wafer W at the same time.

The embodiments of the invention have been described above with reference to examples. The above-described embodiments are illustrative examples and do not limit the invention. In addition, the components according to each embodiment may be appropriately combined with each other.

For example, in the above-described embodiments, the single-wafer-type vapor phase growth apparatus has been described as an example. However, the vapor phase growth apparatus is not limited to the single wafer type as long as it uses the ring-shaped holder 14. The invention can also be applied to a batch-type vapor phase growth apparatus that forms films on a plurality of wafers W at the same time.

For example, the above-described embodiments, a case in which a stacked film obtained by stacking a plurality of indium gallium nitride films and a plurality of gallium nitride films on a GaN film is epitaxially grown has been described as an example. However, for example, the invention can be applied to form other group III-V nitride-based semiconductor single-crystal films, such as an aluminum nitride (AlN) film and an aluminum gallium nitride (AlGaN) film. Furthermore, the invention can be applied to a group III-V semiconductor such as GaAs. In addition, the invention can be applied to form other films.

A case in which the process gas is mixed in the shower plate has been described as an example. However, the process gas may be mixed before it flows into the shower plate. In addition, the process gas may be in a separated state until it is ejected from the shower plate into the reaction chamber.

A case in which the outer portion 50 and the inner portion 52 of the ring-shaped holder 14 are integrally molded has been described as an example. However, the ring-shaped holder 14 may have a structure in which the inner portion 52 or a portion of the inner portion 52 can be separated. When the inner portion 52 or a portion of the inner portion 52 can be separated, for example, the ring-shaped holder 14 with various shapes can be applied and it is easy to finely adjust the temperature distribution of the outer portion of the wafer W.

A case in which two types of heaters, that is, the in-heater 24 and the out-heater 26 are provided as the heater has been described as an example. However, only one type of heater or not less than three types of heaters may be provided.

In the above-described embodiments, for example, portions which are not directly necessary to describe the invention, such as the structure of the apparatus or a manufacturing method, are not described. However, the necessary structure of the apparatus or a necessary manufacturing method can be appropriately selected and used. In addition, all of the vapor phase growth apparatuses which include the components according to the invention and whose design can be appropriately changed by those skilled in the art are included in the scope of the invention. The scope of the invention is defined by the scope of the claims and the scope of equivalents thereof.

What is claimed is:

1. A vapor phase growth apparatus comprising:
a reaction chamber;
a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion, the upper surface of the ring-shaped protrusion being a flat surface, the ring-shaped holder having an opening portion at a center of the ring-shaped holder, a maximum distance between an inner end of the outer portion which is closest to the center of the ring-shaped holder and an outer end of the ring-shaped protrusion which is on a diametrically opposite side of the ring-shaped holder being equal to or smaller than a diameter of the substrate; and
a heater provided below the ring-shaped holder, no component being provided between the heater and a center portion of the substrate,
wherein a diameter of the opening portion is equal to or greater than 90% of a diameter of the substrate, and
wherein an upper part of an inner surface of the outer portion protrudes inward from a lower part of the inner surface of the outer portion and a concave recess having a height greater than the height of the upper surface of the ring-shaped protrusion, but less than the height of the upper surface of the outer portion is formed.

2. The vapor phase growth apparatus according to claim 1,
wherein, in a cross section of the ring-shaped holder in a radial direction, a height of the ring-shaped protrusion is less than a width of the ring-shaped protrusion.

3. A vapor phase growth apparatus comprising:
a reaction chamber;
a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion, the upper surface of the ring-shaped protrusion being a flat surface, the ring-shaped holder having an opening portion at a center of the ring-shaped holder, a maximum distance between an inner end of the outer portion which is closest to the center of the ring-shaped holder and an outer end of the ring-shaped protrusion which is on a diametrically opposite side of the ring-shaped holder being equal to or smaller than a diameter of the substrate; and a heater provided below the ring-shaped holder, no component being provided between the heater and a center portion of the substrate, wherein a diameter of the opening portion is equal to or greater than 90% of a diameter of the substrate, wherein an upper part of an inner surface of the outer portion protrudes inward from a lower part of the inner surface of the outer portion and a concave recess having a height greater than the height of the upper surface of the ring-shaped protrusion, but less than the height of the upper surface of the outer portion is formed, and wherein the ring-shaped holder includes a plurality of island-shaped protrusions provided on the inner end of the outer portion and the island-shaped protrusions are separated from the ring-shaped protrusion.

4. The vapor phase growth apparatus according to claim 3, wherein, in a vertical cross section of each of the island-shaped protrusions, a portion of an inner end of the each of the island-shaped protrusions protrudes inward from another portion.

5. The vapor phase growth apparatus according to claim 4, wherein the portion of the inner end of the each of the island-shaped protrusions is an upper part of the inner end of the each of the island-shaped protrusions.

6. The vapor phase growth apparatus according to claim 3, wherein the number of the plurality of island-shaped protrusions is three or more.

7. The vapor phase growth apparatus according to claim 1, wherein the ring-shaped protrusion is separated from the inner circumference of the inner portion by a predetermined distance.

8. The vapor phase growth apparatus according to claim 1, wherein a corner of an upper end of the ring-shaped protrusion is chamfered.

9. A vapor phase growth apparatus comprising:
a reaction chamber;

a ring-shaped holder provided in the reaction chamber, the ring-shaped holder configured to hold a substrate, the ring-shaped holder including an outer portion, and an inner portion on which a ring-shaped protrusion is provided and surrounded by the outer portion, the ring-shaped protrusion being separated from the outer portion, an upper surface of the outer portion being higher than an upper surface of the ring-shaped protrusion, the upper surface of the ring-shaped protrusion being a flat surface, the ring-shaped holder having an opening portion at a center of the ring-shaped holder, a maximum distance between an inner end of the outer portion which is closest to the center of the ring-shaped holder and an outer end of the ring-shaped protrusion which is on a diametrically opposite side of the ring-shaped holder being equal to or smaller than a diameter of the substrate; and a heater provided below the ring-shaped holder, the heater configured to heat a center portion of the substrate by heat radiated from the heater, wherein a diameter of the opening portion is equal to or greater than 90% of a diameter of the substrate, and wherein an upper part of an inner surface of the outer portion protrudes inward from a lower part of the inner surface of the outer portion and a concave recess having a height greater than the height of the upper surface of the ring-shaped protrusion, but less than the height of the upper surface of the outer portion is formed.

10. The vapor phase growth apparatus according to claim 9, wherein, the heater configured to heat the center portion of the substrate directly by heat radiated from the heater.

11. The vapor phase growth apparatus according to claim 1, wherein the diameter of the opening portion is equal to or greater than 95% of a diameter of the substrate.

12. The vapor phase growth apparatus according to claim 9, wherein the diameter of the opening portion is equal to or greater than 95% of a diameter of the substrate.

* * * * *